United States Patent [19]

Hattori

[11] Patent Number: 5,777,389
[45] Date of Patent: Jul. 7, 1998

[54] SEMICONDUCTOR DEVICE INCLUDING OHMIC CONTACT TO-N-TYPE GAAS

[75] Inventor: Ryo Hattori, Tokyo, Japan

[73] Assignee: Mitsubishi Denki Kabushiki Kaisha, Tokyo, Japan

[21] Appl. No.: 595,220

[22] Filed: Feb. 1, 1996

[30] Foreign Application Priority Data

Jul. 27, 1995 [JP] Japan ................... 7-191572

[51] Int. Cl.$^6$ ................... H01L 29/43
[52] U.S. Cl. ................... 257/744; 257/741; 257/745; 257/763; 257/765; 257/751; 257/771
[58] Field of Search ................... 257/763, 764, 257/765, 767, 770, 751, 771, 485, 486, 741–745

[56] References Cited

U.S. PATENT DOCUMENTS

| 4,141,020 | 2/1979 | Howard et al. | 257/486 |
| 5,260,603 | 11/1993 | Kamura et al. | 257/764 |
| 5,589,712 | 12/1996 | Kawashima et al. | 257/763 |

FOREIGN PATENT DOCUMENTS

| 55-128865 | 6/1980 | Japan . |
| 63-221669 | 9/1988 | Japan . |
| 63-252471 | 10/1988 | Japan . |

OTHER PUBLICATIONS

Wada et al. "Schottky Barrier Height Variation With Metallurgical Reactions in Aluminum–Titanium–Gallium Arsenide Contacts", Solid State Electronics, vol. 26, No. 6, 1983, pp. 559–564.

Primary Examiner—David B. Hardy
Attorney, Agent, or Firm—Leydig, Voit & Mayer, LTD.

[57] ABSTRACT

A method for fabricating a semiconductor device includes: successively laminating a pair or more pairs of Ti and Al thin films on an n type GaAs substrate thereby to form Ti/Al laminated films; and performing thermal processing to the n type GaAs substrate and the Ti/Al laminated films at a temperature lower than the temperature at which Al of the Ti/Al laminated films and GaAs of the n type GaAs layer react with each other, to make the Ti/Al laminated films have ohmic junction with the n type GaAs layer thereby to form an ohmic electrode. Therefore, the Ti/Al laminated layer film comprising materials which are not likely to intrude into the n type GaAs layer is alloyed to $Al_3Ti$ alloy by the annealing, and during the annealing, Ga atoms are outmigrated from the n type GaAs layer, and the Si atoms as dopants in the n type GaAs layer are present in the junction interface of the n type GaAs layer with the Ti/Al laminated layer film, thereby to form an ohmic contact. Thereby, a semiconductor device provided with ohmic electrodes having heat-resistant property and shallow junction surfaces is obtained.

5 Claims, 9 Drawing Sheets

$E_0 = E_{00} \coth(E_{00}/kT)$ 0  50 Angstrom

1

SEMICONDUCTOR DEVICE INCLUDING OHMIC CONTACT TO-N-TYPE GAAS

FIELD OF THE INVENTION

The present invention relates to a method of fabricating a semiconductor device and a semiconductor device and, more particularly, to a method of fabricating a semiconductor device provided with an ohmic metallic electrode free of gold and a semiconductor device fabricated thereby.

BACKGROUND OF THE INVENTION

As an electrode which is in ohmic contact with an n type GaAs crystal and as a typical electrode material that can produce a low contact resistance, an AuGe/Ni based material, i.e., a laminated film of AuGe and Ni has been widely utilized.

FIGS. 10(a)–10(d) show a prior art method of fabricating a recess type field effect transistor as an example of a semiconductor device having an AuGe/Ni ohmic electrode on an n type GaAs crystal. Reference numeral 1 designates a semi-insulating GaAs substrate. Reference numeral 2 designates an intrinsic (hereinafter referred as "i") GaAs layer. Reference numeral 3 designates a first n type GaAs layer including Si as a dopant impurity in a concentration of $1$–$3\times10^{17}$ cm$^{-3}$. Reference numeral 4 designates a second n type GaAs layer including Si as a dopant impurity in a concentration of $5\times10^{18}$ cm$^{-3}$. Reference numeral 5 designates an AuGe/Ni laminated film comprising an Ni layer of 100 Å thickness and an Au layer of 2000 Å thickness successively laminated on an AuGe layer of 500 Å thickness. Reference numerals 5a and 5b designate a source and a drain electrode, respectively. Reference numeral 7 designates a gate electrode having a width of about 0.5 μm formed by successively disposing Al of 4000 Å thickness and Mo of 500 Å thickness on Ti of 1500 Å thickness, to form a Schottky junction with the first n type GaAs layer 3. Reference numeral 8 designates a gate recess of width of 1.2–1.5 μm and a depth of about 0.3 μm. Reference numeral 6 designates a resist.

A description is given of the fabricating method. First of all, as shown in FIG. 10(a), an i-GaAs layer 2, a first n type GaAs layer, and a second n type GaAs layer are successively grown on a GaAs substrate 1 by MBE (molecular beam epitaxy) or MOCVD (metal organic chemical vapor deposition).

Next, as shown in FIG. 10(b), an AuGe/Ni laminated layer film 5 is formed at positions where a source electrode and a drain electrode are to be formed, by evaporation, and annealed at a temperature of about 390° C., thereby forming AuGe/Ni ohmic electrodes 5a, 5b.

Subsequently, a resist 6 having an aperture at a portion for forming gate recess 8 is formed on the ohmic electrodes 5a, 5b and the second n type GaAs layer 4, and the second n type GaAs layer 4 and an upper portion of the first n type GaAs layer 3 are wet etched to form the gate recess 8 (FIG. 10(c)) and the resist 6 is removed, thereby resulting in a recess type field effect transistor as shown in FIG. 10(d).

Next, a description is given of the AuGe/Ni ohmic electrode.

The AuGe/Ni ohmic electrodes 5a, 5b are provided for obtaining low contact resistances by annealing the AuGe/Ni laminated layer film 5 at a temperature of about 380° C., which is the eutectic temperature of AuGa. When the AuGe/Ni laminated layer film 5 is annealed at that temperature, Ga vacancies are produced in the second n type GaAs layer 4 which is in contact with the AuGe/Ni laminated layer film 5 due to the AuGa alloying reaction. Ge atoms move into the Ga vacancies as donor impurities to form a high donor concentration region in the GaAs crystal at the junction, forming an ohmic junction, resulting in a low contact resistance. The Ni film formed on the second n type GaAs layer fulfills the important function of conveying Ge atoms to the interfaces between the GaAs layer 4 and the ohmic electrodes 5a, 5b so that the Ge atoms are not precipitated at the surface of the ohmic electrodes 5a, 5b in the annealing process.

FIGS. 9(a) and 9(b) show the structure of the vicinity of the ohmic junction of the AuGe/Ni ohmic electrode formed on the n type GaAs layer, where FIG. 9(a) is a cross-section TEM (transmission electron microscope) image and FIG. 9(b) is a diagram which depicts FIG. 9(a) schematically. In both figures, reference numeral 40 designates an ohmic electrode, numeral 41 designates an n type GaAs layer, numeral 42 designates Au, numeral 43 designates AuGa, numeral 44 designates GaAs, numeral 45 designates NiGeAs, numeral 46 designates NiAs, numeral 47 designates NiAs including Ge, and numeral 48 designates NiGe. From these figures, it is found that the alloying reaction has advanced at the junction interface up to a depth of 600–900 Å to the n type GaAs crystal in the annealing.

The AuGe/Ni based ohmic electrodes having an AuGe film and an Ni film are widely used in electronic devices and optical devices as ohmic electrodes for GaAs based and InP based mixed crystal semiconductor such as n type AlGaAs, InGaAs, AlInAs, and InGaP, and is not limited to GaAs devices.

However, while the AuGe/Ni based ohmic electrodes alloy due to annealing in the n type GaAs crystal in the vicinity of the junction interface, the above-described alloying reaction at the formation of the ohmic electrode further advances into the n type GaAs layer during the annealing performed in the fabricating process after forming the ohmic electrode or the heat generated in the operation of the device and, therefore, Au may enter the GaAs as spikes or by the intrusion of Au, extra Ga and As may be precipitated at the ohmic junction interface and stored thereat, whereby there occurs deterioration of ohmic junction interface and raising of the contact resistance of the ohmic electrode, a problem in achieving good thermal stability.

In addition, because the AuGe/Ni based ohmic electrode has moved the alloying reaction to the depth of 600–900 Å in the n type GaAs at the junction interface by annealing as shown in FIGS. 9(a) and 9(b), when it is employed as an ohmic electrode for a thin channel in a high speed semiconductor device, the alloying reaction penetrates the channel layer, deepening the junction interface, whereby a semiconductor device provided with a desired property cannot be obtained.

In addition, as well known generally, Au and Al, when they are in contact form an inter-metallic compound that is called the "purple plaque", thereby making it difficult to adhere Al wiring to the AuGe/Ni based electrode, whereby it has been difficult to use Al wiring. Therefore, an Au wiring is actually widely used. However, because the Au wiring cannot be dry etched, different from the Al wiring, it was impossible to conduct patterning of fine wiring using dry etching.

SUMMARY OF THE INVENTION

It is an object of the present invention to provide a method for fabricating a semiconductor device provided with an ohmic electrode that is superior in heat resistance, that has a shallow junction interface, and that can be connected with the Al wiring.

It is another object of the present invention to provide a semiconductor device provided with an ohmic electrode that is superior in the heat resistance that has a shallow junction plane, and that can be connected with the Al wiring.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a method for fabricating a semiconductor device includes successively laminating a pair or more pairs of Ti and Al thin films on an n type GaAs substrate thereby to form Ti/Al laminated films: and performing thermal processing to the n type GaAs substrate and the Ti/Al laminated films at a temperature lower than the temperature at which Al of the Ti/Al laminated films and GaAs of the n type GaAs layer react with each other to make the Ti/Al laminated films have ohmic junction with the n type GaAs layer thereby to form an ohmic electrode.

Therefore, the Ti/Al laminated layer film comprising materials which are not likely to intrude into the n type GaAs layer is alloyed to $Al_3Ti$ alloy by the annealing, and during the annealing. Ga atoms are out-migrated from the n type GaAs layer, and the Si atoms as dopants in the n type GaAs layer are present in the junction interface of the n type GaAs layer with the Ti/Al laminated layer film, thereby to form an ohmic contact. Thereby, a semiconductor device provided with ohmic electrodes having heat-resistant property and shallow junction surfaces is obtained.

According to a second aspect of the present invention, in the above-described fabricating method, the thermal processing is performed at a temperature below 400° C.

According to a third aspect of the present invention, in the above-described fabricating method, the thickness ratio of the Ti film and the Al film is 1:3

According to a fourth aspect of the present invention, in the above-described fabricating method, the thicknesses of the Ti film and the Al film are both less than 100 Å.

According to a fifth aspect of the present invention, the above-described fabricating method further comprises, after forming the Ti/Al laminated films, a process of forming an Al wiring layer on the laminated film.

Therefore, the connection between the ohmic electrodes and the Al wirings is eased, and a semiconductor device provided with Al wirings which can be formed as fine patterns is obtained.

According to a sixth aspect of the present invention, the above-described fabricating method further comprises, a process of forming a barrier layer comprising a refractory metal layer between the Ti/Al laminated layer films and the Al wiring layer.

Therefore, a semiconductor device in which the Ga atoms are prevented from intruding into the Al wirings, whereby deterioration of the Al wiring is prevented is obtained.

According to a seventh aspect of the present invention, a semiconductor device includes, an n type GaAs layer; an electrode disposed on the n type GaAs layer, including a pair or more pairs of thin Ti and thin Al film, and $Al_3Ti$ alloy which is in contact with the n type GaAs layer and formed from a portion of Ti film and Al laminated film; a high dopant concentration region provided in the vicinity of the junction interface of the n type GaAs layer with the electrode; and the electrode being in contact with the n type GaAs layer.

Therefore, the Ti/Al laminated layer film comprising a material which is not likely to intrude into the n type GaAs layer is alloyed to $Al_3Ti$ alloy by the annealing, and during the annealing. Ga atoms are out-migrated from the n type GaAs layer, and the Si atoms as dopants in the n type GaAs layer are present in the junction interface of the n type GaAs layer with the Ti/Al laminated layer film to form an ohmic contact, whereby a semiconductor device provided with ohmic electrodes having heat-resistant property and shallow junction surfaces is obtained.

According to an eighth aspect of the present invention, in the above-described semiconductor device, the thickness ratio of the Ti film and the Al film is 1:3.

According to a ninth aspect of the present invention, in the above-described semiconductor device, the thicknesses of the Ti film and the Al film are both less than 100 Å.

According to a tenth aspect of the present invention, in the above-described semiconductor device, an Al wiring layer is formed on the electrode.

Therefore, the connection between the ohmic electrodes and the Al wirings is eased, whereby a semiconductor device provided with Al wirings which can be formed as fine patterns is obtained.

According to an eleventh aspect of the present invention, in the above-described semiconductor device, the Al wiring layer is formed on the electrode via a barrier layer comprising a refractory metal layer.

Therefore, a semiconductor device in which the Ga atoms are prevented from intruding into the Al wirings, whereby deterioration of the Al wiring is prevented is obtained.

DETAILED DESCRIPTION OF THE PREFERRED EMBODIMENTS

Embodiment 1

Figure 1:
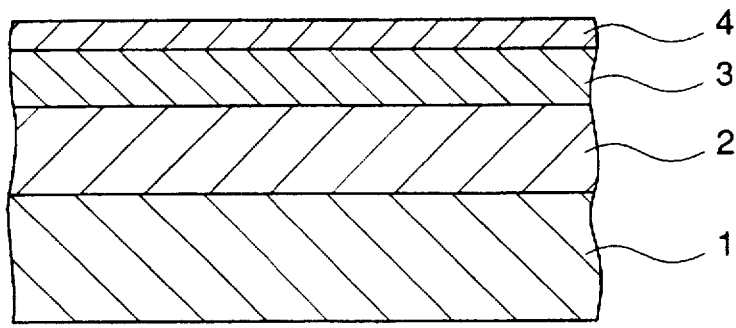
FIGS. 1(a)–1(d) are diagrams for explaining a method for fabricating a semiconductor device according to a first embodiment of the present invention.
Figure 1:
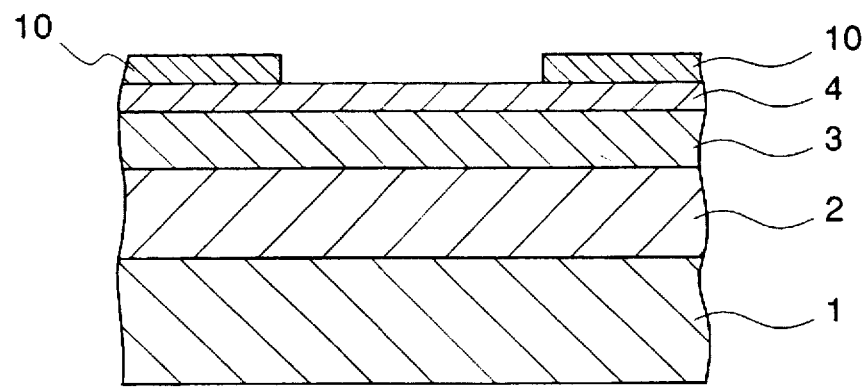
Figure 1:
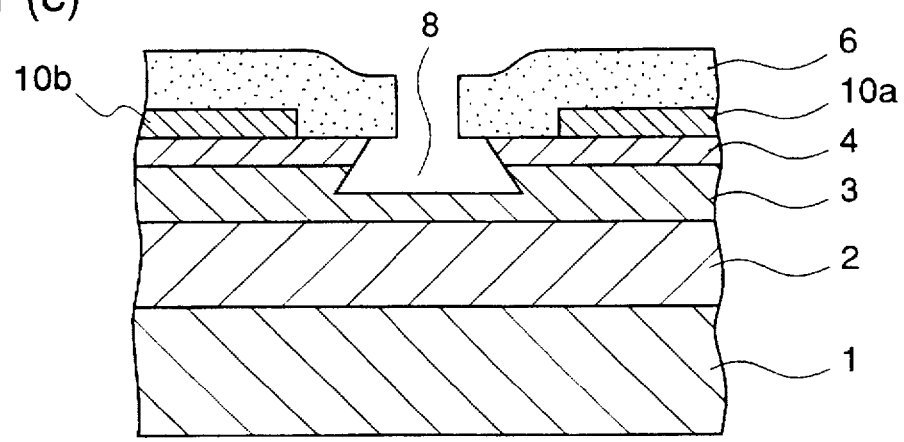
Figure 1:
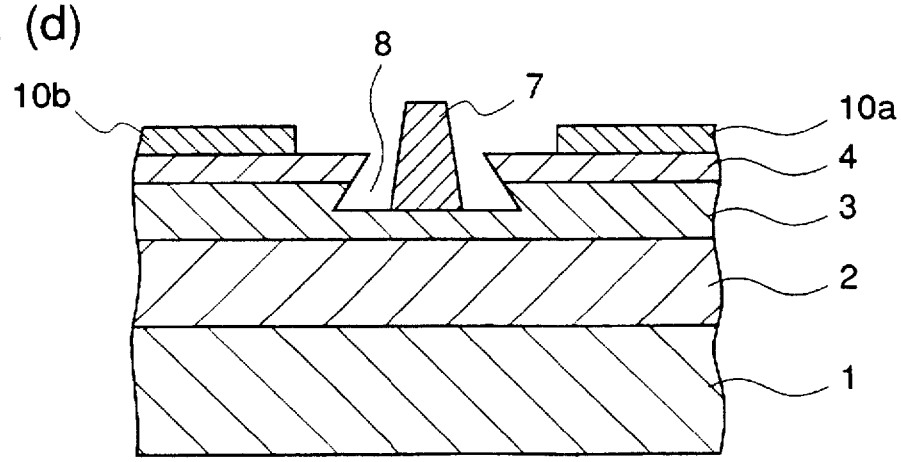

FIGS. 1(a)–1(d) are diagrams illustrating process steps for fabricating a semiconductor device according to a first embodiment of the present invention. In the figures, reference numeral 1 designates a semi-insulating GaAs substrate. Reference numeral 2 designates an intrinsic GaAs layer. Reference numeral 3 designates a first n type GaAs layer including Si as a dopant impurity in a concentration of $1-3\times10^{17}$ cm$^{-3}$. Reference numeral 4 designates a second n type GaAs layer including Si as a dopant impurity in a concentration of $5\times10^{18}$ cm$^{-3}$. Reference numeral 7 designates a gate electrode of about 0.5 μm width and this comprises a Ti layer of 1500 Å thickness, and an Al layer of 4000 Å thickness and a Mo layer of 500 Å thickness successively disposed on the Ti layer so as to form a Schottky junction with the first n type GaAs layer 3. Reference numeral 8 designates a gate recess having a width of 1.2–1.5 μm and a depth of about 0.3 μm. Reference numeral 6 designates a resist. Reference numeral 10 designates a Ti/Al laminated layer film, numerals 10a, 10b designate Ti/Al ohmic electrodes serving as a source electrode and a drain electrode, respectively.

Figure 6:
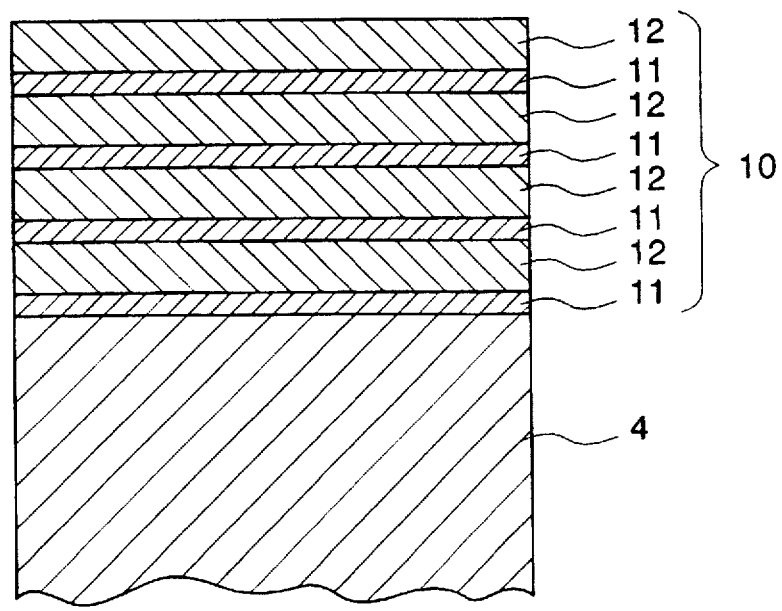
FIG. 6 is a diagram illustrating a structure in the vicinity of the ohmic electrode of the semiconductor device according to the first embodiment of the present invention.

FIG. 6 is a cross-sectional view illustrating a structure of a main portion of a semiconductor device according to a first embodiment of the present invention. In the figure, the same reference numerals designate the same or corresponding elements as those in FIGS. 1(a)–1(d). Reference numeral 11 designates a Ti layer of 10 Å thickness, and reference numeral 12 designates an Al layer of 30 Å thickness. The Ti/Al laminated layer film of this embodiment is formed by laminating four Ti layers 11 and four Al layers 12 alternatingly on the second n type GaAs layer 4.

While in this first embodiment a recess type field effect transistor is employed, the present invention can be applied to other semiconductor devices.

Figure 7:
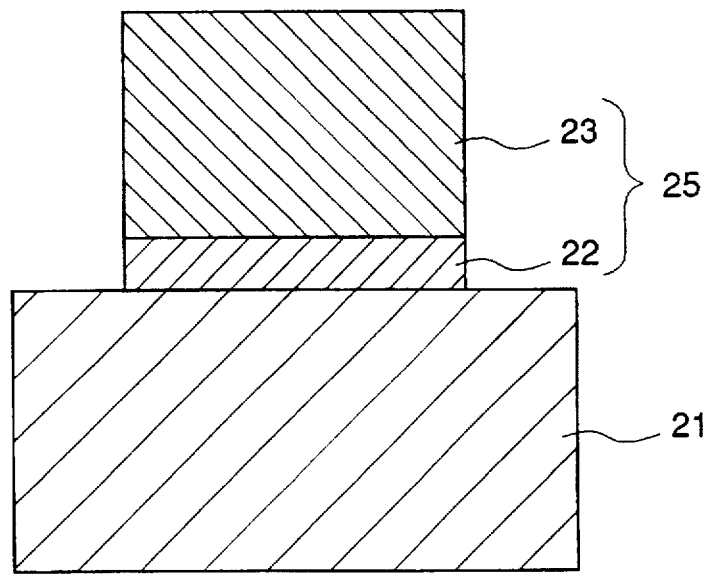
FIGS. 7a and 7b are diagrams illustrating the structure of the ohmic electrode of the semiconductor device according to the first embodiment of the present invention.
Figure 7:
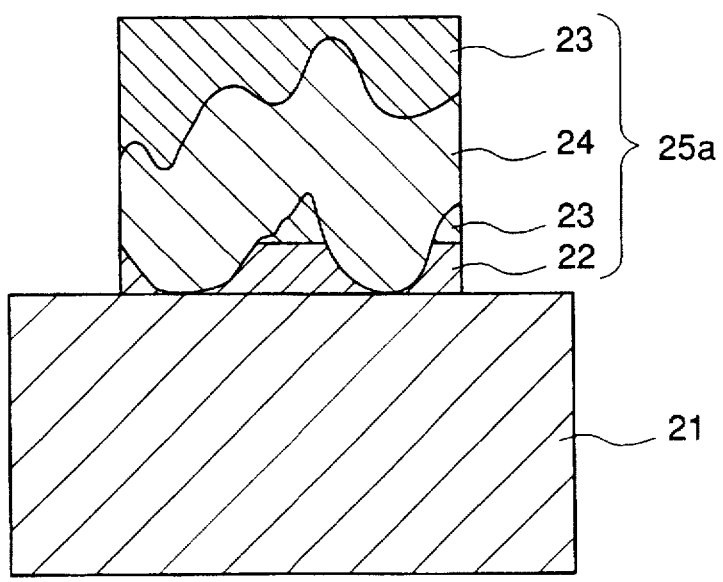

FIGS. 7(a)–7(b) are schematic diagrams for explaining the structure of a Ti/Al ohmic electrode formed on the n type GaAs substrate in the semiconductor device according to a first embodiment of the present invention. In the figure, numeral 21 designates an n type GaAs layer including Si as a dopant impurity in a concentration of $5\times10^{18}$/cm$^{-3}$, numeral 21 designates a Ti film about 500 Å thick, numeral 23 designates an Al film about 4000 Å thick, numeral 24 designates an Al$_3$Ti alloy particle, numeral 25 designates a laminated layer film, and numeral 25a designates an ohmic electrode.

A description is given of the Ti/Al film formed on the n type GaAs layer 21 in the semiconductor device according to the first embodiment. The junctions between the n type GaAs layer and the Ti layer and between the Ti layer and the Al layer, i.e., the junctions of the n type GaAs/Ti/Al junction become Schottky junctions when the dopant concentration of the n type GaAs layer is below $10^{18}$ cm$^{-3}$. Therefore it is usually used as a gate electrode and the junction barrier height $\Phi_B$ of the gate electrode is about 0.7 eV.

Figure 2:
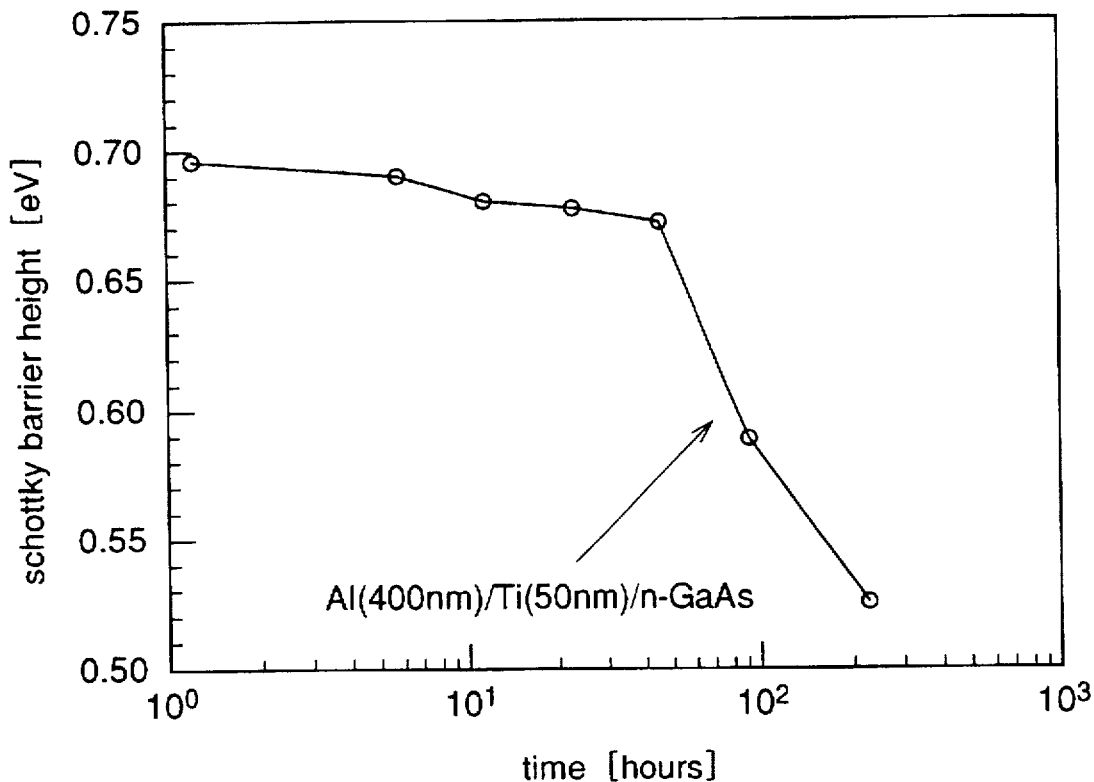
FIG. 2 is a diagram for explaining the change due to thermal processing of the junction barrier height of the semiconductor device according to the first embodiment of the present invention.

FIG. 2 shows the change with the passage of time of the junction barrier height $\Phi_B$ of the junction between the n type GaAs layer 21 and the laminated layer films 25 comprising the Ti film 22 500 Å thick and the Al film 23 4000 Å thick shown in FIG. 7(a) when it is held at a temperature of 300° C. In FIG. 2, the abscissa represents time (hours), and the ordinate represents the junction barrier height (eV). As is apparent from FIG. 2, after fifty hours pass, the junction barrier height $\Phi_B$ rapidly decreases.

Figure 4:
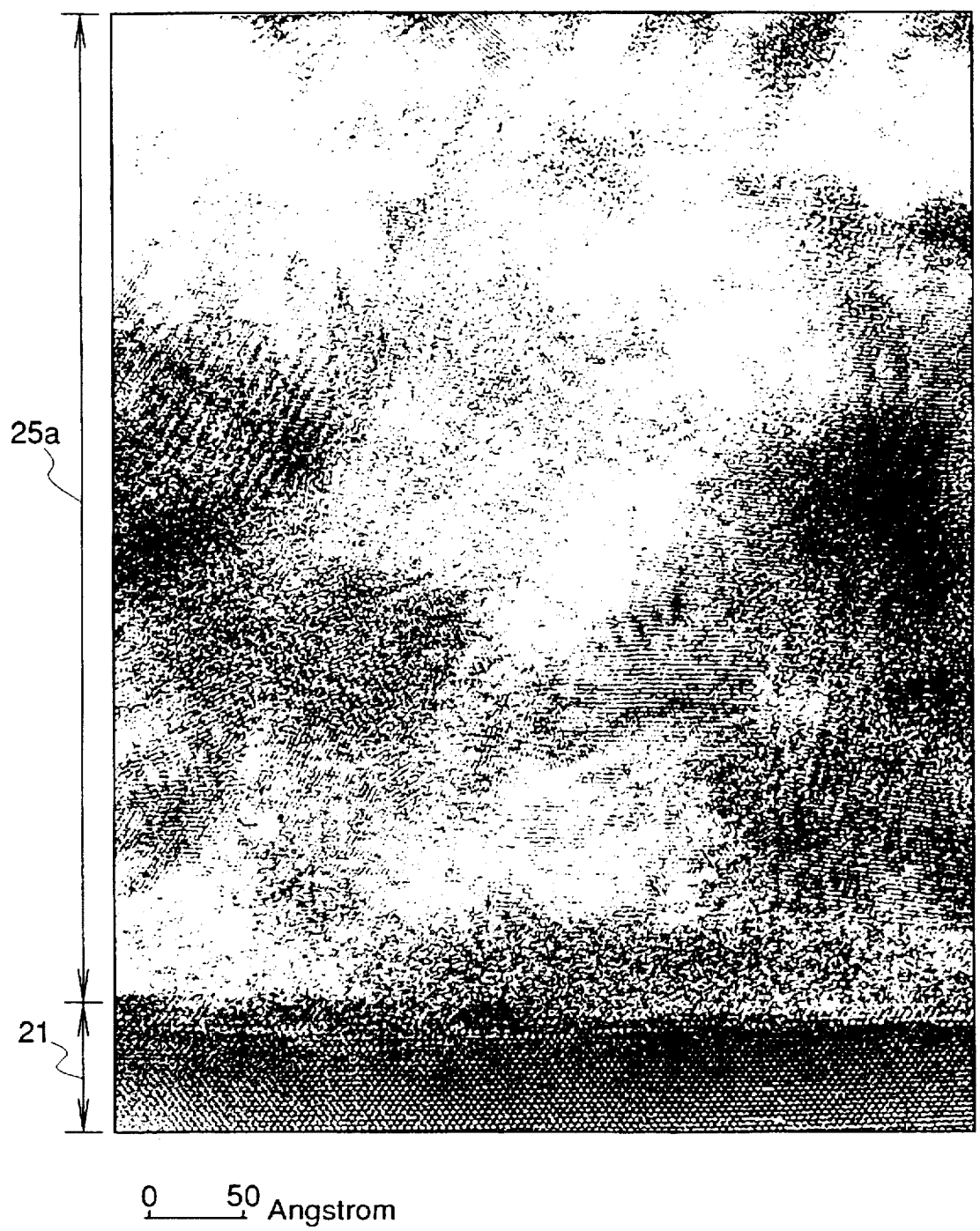
FIG. 4 is a diagram illustrating the interface between the n type GaAs layer and the electrode part of the semiconductor device according to the first embodiment of the present invention.
Figure 9:
FIGS. 9(a)–9(b) are diagrams illustrating a structure in the vicinity of the junction interface of the ohmic electrode of the prior art semiconductor device.
Figure 9:
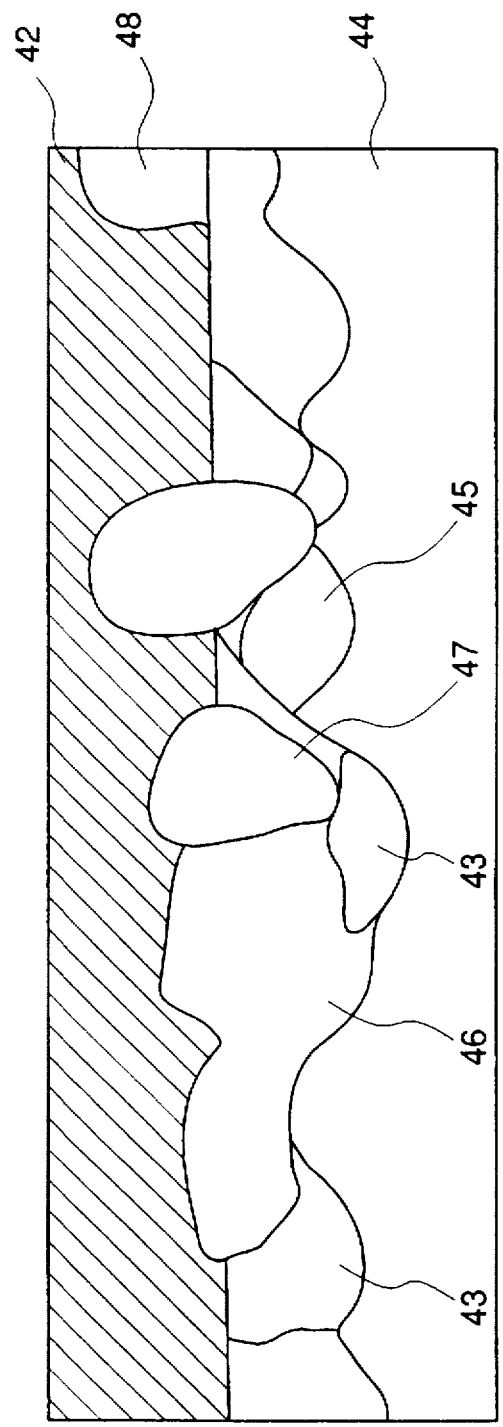
Figure 10:
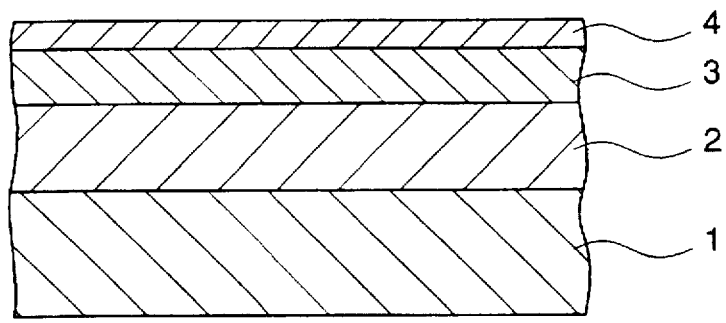
FIGS. 10(a)–10(d) are diagrams illustrating a prior art method of fabricating a semiconductor device.
Figure 10:
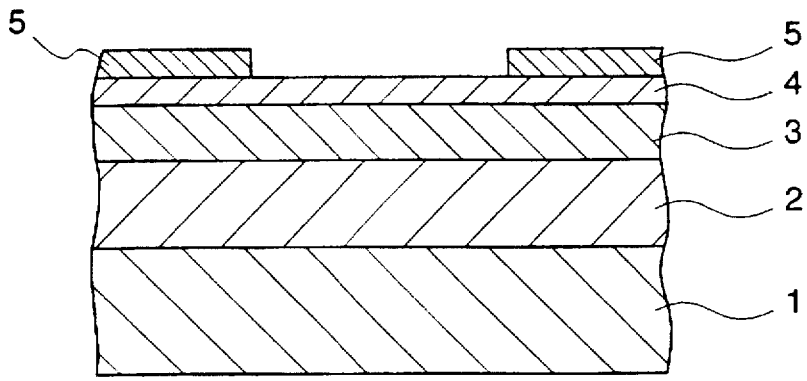
Figure 10:
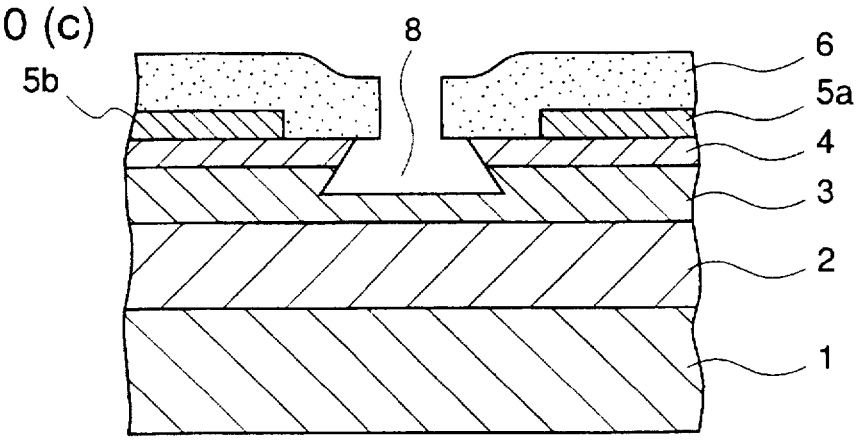
Figure 10:
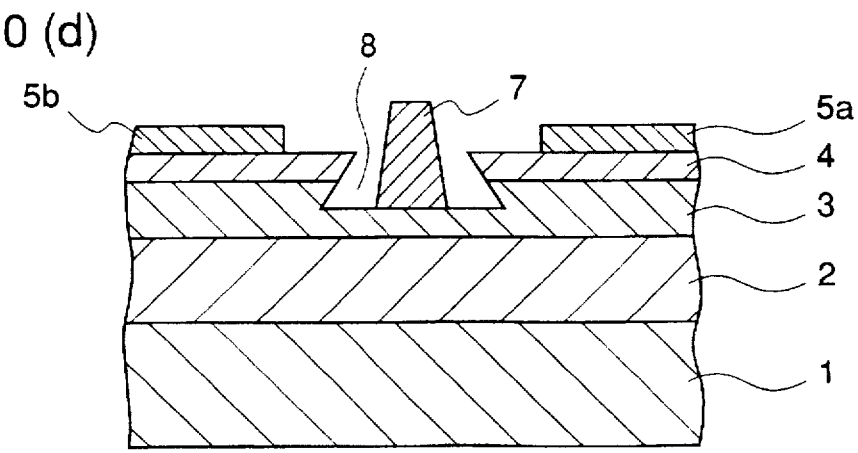

FIG. 4 shows a diagram which has depicted the TEM (transmission electron microscope) image in the vicinity of the junction interface in a state where the junction barrier height is little reduced. In the figure, numeral 21 designates an n type GaAs substrate, and numeral 25a designates an ohmic electrode. The sinking of the electrode material into the n type GaAs layer formed by the alloy reaction which is observed in the AuGe/Ni based ohmic electrode described in the prior art shown in FIG. 9 is not observed this time and, therefore, it is found that no material of the ohmic electrode 25a intrudes into the n type GaAs layer. In addition, there are seen alloy particles of cross-hatched shape included in the ohmic electrodes due to the inter-metallic reaction between Ti and Al. These alloy particles are confirmed to be Al$_3$Ti alloy particles by XRD (X ray reflection diffraction) analysis. The Al$_3$Ti alloy is a refractory metal that is quite hard and light, and is a new material. However, it is quite difficult to make that material monocrystallized because it is microcrystallized by residual oxygen. When the vicinity of the interface of the alloy particles which is seen in FIG. 4 is EDX analyzed, a lot of Ga atoms are detected. The structure of the ohmic electrode 25a is schematically shown in FIG. 7(b). The Al$_3$Ti alloy particles 24 are formed by the inter-metallic reaction between Ti and Al and is partially in contact with the n type GaAs layer 21.

Figure 5:
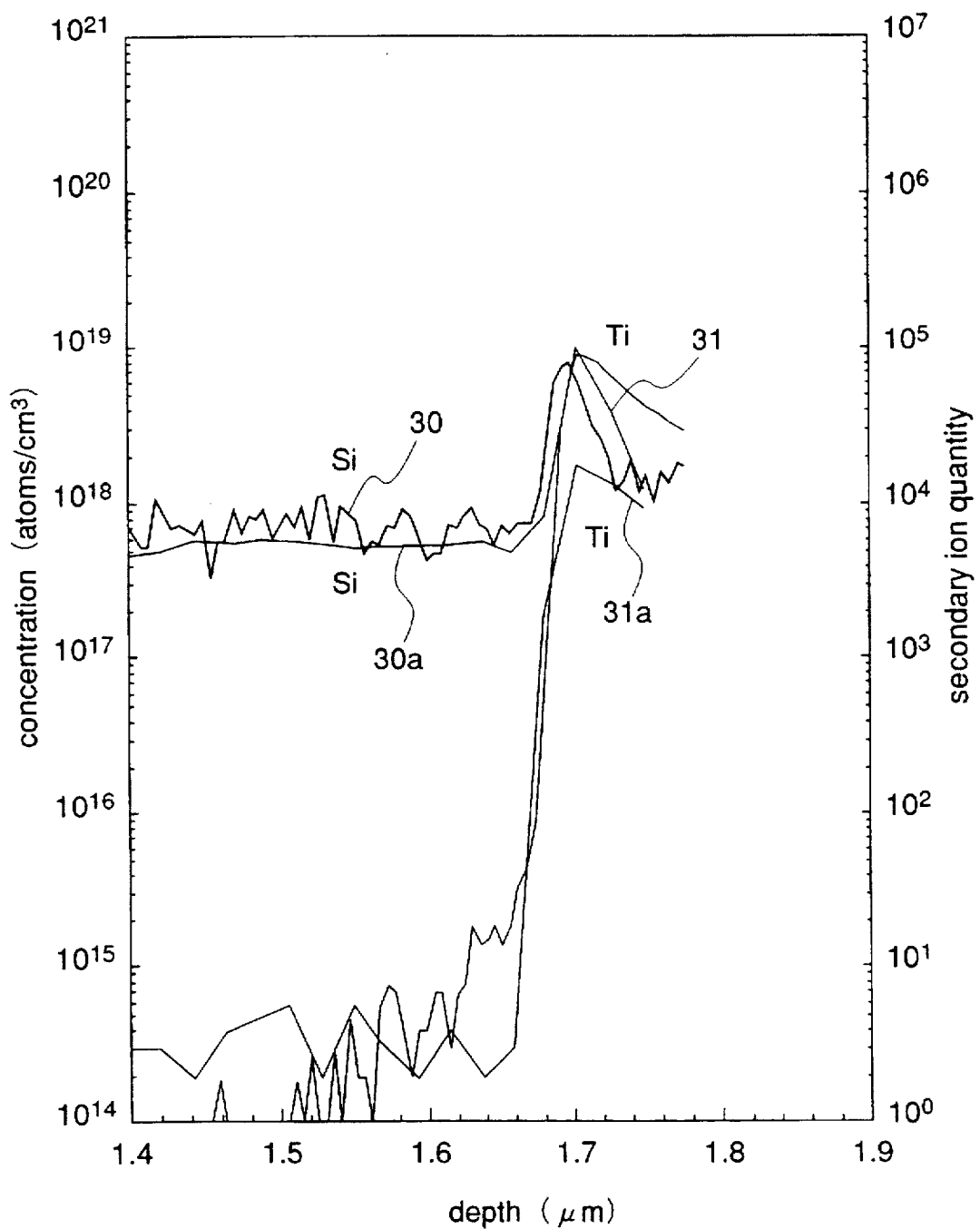
FIG. 5 is a diagram illustrating the result of SIMS analysis of a semiconductor device according to a first embodiment of the present invention.

FIG. 5 shows a SIMS (secondary ion mass spectrometer) depth profile which is obtained by measuring this material from the rear surface of the n type GaAs layer 21. In FIG. 5, the abscissa represents depth (μm) from the rear surface of the n type GaAs layer 21, the ordinate at right represents secondary ion quantity, and the ordinate at left represents atom concentration (atoms/cm$^3$) converted from the secondary ion quantity. Numeral 30 designates a Si profile, numeral 30a represents a value averaging the Si profile, numeral 31 designates a Ti profile, and numeral 31a represents a value averaging the Ti profile. In FIG. 5, at the position around the depth of 1.68 μm, an interface between the ohmic electrode 25a and the n type GaAs layer 21 is present. As is seen from this result, though no intrusion of Ti or Al from the ohmic electrode 25a into the GaAs crystal 21 is seen, interface precipitation of Si as the n type dopant is seen at the interface between the ohmic electrode 25a and the n type GaAs layer 21.

Figure 3:
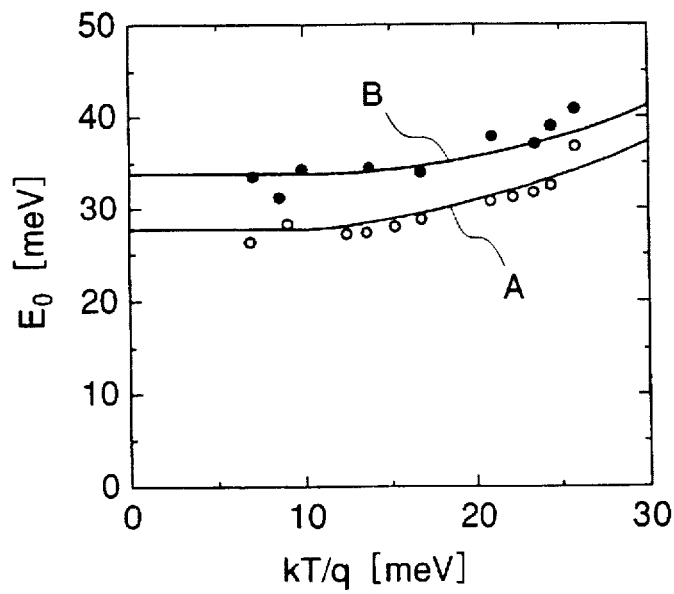
FIG. 3 is a diagram illustrating the result obtained by analyzing the temperature dependency of the forward direction current vs. voltage (I–V) characteristics of the semiconductor device according to the first embodiment of the present invention by using the Thermionic Field Emission Model.

Now the result that the temperature dependency of the forward direction current—voltage (I–V) characteristics of the Schottky characteristics of the material which has reduced its junction barrier height $\Phi_B$ is analyzed by the Thermionic Field Emission Model (TF-E Model,) considering the tunnel current component, which is described in Solid-State Electronics Vol. 9, 1966, pp. 695–707, by F. A. Padovani and R. Stratton, is shown in FIG. 3 and in the following table, and the result of the analysis by the Thermionic Emission Model (T-E Model,) not considering the tunnel current component, is shown in the following table. In the following table and FIG. 3, reference characters A and B represent materials having the different junction barrier heights $\Phi_B$ respectively, and $\Phi_B{}^0$ and N* represent the junction barrier height and the interface carrier concentration obtained by using the Thermionic Field Emission Model, respectively.

TABLE

|   | T-E Model | TF-E Model |
|---|---|---|
| A | n = 1.45 | $N^* = 2 \times 10^{18}$ cm$^{-3}$ |
|   | $\Phi_B$ = 0.49 eV | $\Phi_B^0$ = 0.70 eV |
| B | n = 1.86 | $N^* = 2 \times 10^{18}$ cm$^{-3}$ |
|   | $\Phi_B$ = 0.40 eV | $\Phi_B^0$ = 0.69 eV |

It is found that the junction barrier height $\Phi_B$ which is estimated using the Thermionic Emission Model, which is applicable only to a region which has a low carrier concentration and where the tunnel current component can be ignored, is underestimated and that the interface carrier concentration has rather increased more than one order of magnitude from the result which is obtained by analyzing the same using the Thermionic Field Emission Model.

This results from the fact that the alloying reaction between the Ti film 22 and the Al film 23 due to the annealing of the Ti/Al laminated layer film 25 advances from the Al/Ti junction interface. When the Al$_3$Ti alloy particle 24 reaches the GaAs crystal interface 21, as is shown in FIG. 7(b), the Ga atoms migrate out along the boundaries of the alloy particles, i.e., move toward outside from the n type GaAs layer 21. As a result, the Si atoms serving as n type dopants in the n type GaAs layer 21 move into the Ga vacancies formed in the vicinity of the interface of the n type GaAs layer 21, thereby causing donor activation and increasing the carrier concentration at the interface. Thereby, the tunnel current component which passes through the Schottky barrier between the electrode part 25 and the n type GaAs layer 21 rapidly increases and makes the junction change into an ohmic contact.

As described above, the Ti layer 22 and the Al film 23 are laminated on the surface of the n type GaAs layer 21, and are annealed, and the Ti/Al inter-metal reaction is generated at the junction with the n type GaAs 21, whereby an ohmic electrode 25a having an ohmic junction is formed.

Disclosed in Solid-State Electronics Vol. 26, 1983, pp. 559-564, is a method in which an n type GaAs layer is formed on a Ti/Al laminated film, it is annealed at a temperature of 400° C., thereby forming a Schottky electrode and, a GaAlAs layer is formed at the interface between the electrode and the n type GaAs layer, whereby the junction barrier height is increased. Accordingly, since when the annealing is performed at a high temperature, above 400° C., while forming the ohmic electrode by forming the Ti/Al laminated layer film on the n type GaAs layer and performing annealing, Al and GaAs would react with each other to form an AlGaAs crystal and increase the energy band gap, which also increases the barrier height $\Phi_B$, resulting in no ohmic electrode. Therefore, the annealing condition for obtaining an ohmic electrode should be performed at a temperature of less than 400° C. at which Al and GaAs do not react with each other. The optimal condition for performing the annealing is 300° C.-350° C.

A description is given of a method of fabricating a semiconductor device according to a first embodiment of the present invention. First of all, in the step of FIG. 1(a), on a GaAs substrate 1, an i type GaAs layer 2, a first n type GaAs layer, and a second n type GaAs layer are successively epitaxially grown by MBE or MOCVD.

Next, in the step of FIG. 1(b) and also shown in FIG. 6, using a resist pattern (not shown), four Ti layers 11 each 10 Å thick and four Al layers each 30 Å thick are alternatingly deposited by evaporation where a source and a drain electrodes are to be formed, thereby forming a Ti/Al laminated layer film 10, and annealed at a temperature of 350° C. for ten minutes. During the annealing, a Ti/Al inter-metallic reaction occurs to form Al$_3$Ti alloy particles (not shown) reaching the n type GaAs layer 4, and Ga atoms migrate out from the n type GaAs layer 4, which increases the concentration of Si atoms as n type dopants at the junction interface, thereby forming ohmic electrodes 10a, 10b having ohmic junctions.

While in the above-described embodiment, the film thickness ratio between the Ti film 11 and the Al film 12 is set to 1:3 to easily produce the alloy reaction between Ti and Al thereby to form the Al$_3$Ti alloy, Ti/Al laminated layer films having film thickness ratios which are different from the above-described ratio (1:3) may be employed. In addition, as the film in contact with the n type GaAs layer, a Ti film 11 is preferred, because Ti is superior in adhesive to the n type GaAs crystal. In addition, the respective thickness of each Ti film 11 and Al film 12 is preferred to be less than 100 Å so as to increase the efficiency of the ohmic electrode formation process by shortening the annealing time for forming the ohmic junction.

Subsequently, in the step of FIG. 1(c), resist 6 having apertures at intermediate positions between the ohmic electrodes 10a and 10b where a gate recess 8 is to be formed, covering the ohmic electrodes 10a, 10b, and on the second n type GaAs layer 4 is formed. Using this resist 6 as a mask, the second n type GaAs layer 4 and an upper portion of the first n type GaAs layer 3 are wet-etched to form a gate recess 8. Further, the resist 6 is removed, thereby producing the semiconductor device shown in FIG. 1(d).

The ohmic electrodes 10a, 10b of the first embodiment do not use gold which is likely to produce an alloy reaction and intrude into the n type GaAs layer at the junction interface in a spike shape as in the prior art electrode material. Therefore, even in the annealing while forming the ohmic electrodes 10a, 10b as shown in FIG. 4, the electrode material does not cause an alloy reaction with the second n type GaAs layer 4 and does not intrude into the junction interface with the second n type GaAs layer 4. Further, the electrode material does not enter the junction interface with the second n type GaAs layer 4 even when annealing is performed in a later process or the device is heated during its operation, thereby causing no deterioration of the junction interface. Accordingly, a semiconductor device provided with ohmic electrodes 10a, 10b superior in heat resistance is obtained.

In the first embodiment, the electrode material which has alloyed does not enter the second n type GaAs layer 4, thereby providing a shallow junction depth. Therefore, there arises no problem as in the AuGe/Ni based ohmic electrodes of the prior art that the alloy reaction proceeds into a depth direction at the junction surface in the n type GaAs layer, and the alloy reaction penetrates the channel layer in a spike shape even when it is used as an ohmic electrode for a thin channel layer. Therefore, it can be used as an ohmic electrode for a thin channel layer.

In this first embodiment, the Ti/Al laminated layer film 12 comprising the Ti film 11 and the Al film 12 is formed on the second n type GaAs layer 4, and annealing is performed at a temperature at which Al and GaAs do not react with each other to form an AlGaAs crystal, which forms an ohmic junction. Therefore, a semiconductor device provided with an ohmic electrode superior in heat resistance and having a shallow junction can be obtained.

While in the first embodiment, four Ti layers 11 and four Al layers 12 are alternatingly laminated to form the Ti/Al laminated layer film 10, the present invention can be applied to cases where at least one Ti layer and at least one Al layer are laminated to form a Ti/Al laminated layer film, which would also cause an alloy reaction, with the same effects as described above.

In addition, although in the first embodiment, Si is employed as the dopant of the second n type GaAs layer 4, the present invention can be applied for Se, Te, and another n type dopants, which would also produce the same effects as described above.

Embodiment 2

Figure 8:
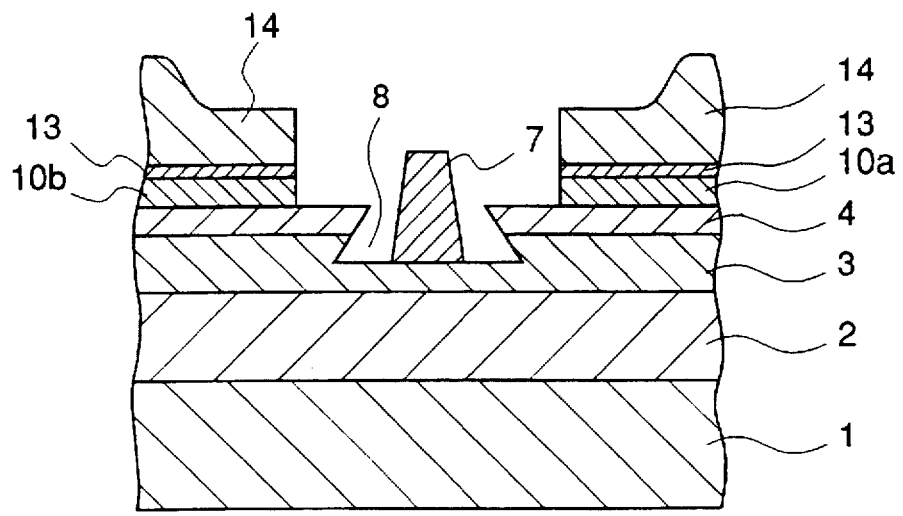
FIGS. 8(a)–8(b) are diagrams illustrating a structure of a semiconductor device according to a second embodiment of the present invention and a structure of an ohmic electrode of the semiconductor device according to the second embodiment of the present invention, respectively.
Figure 8:
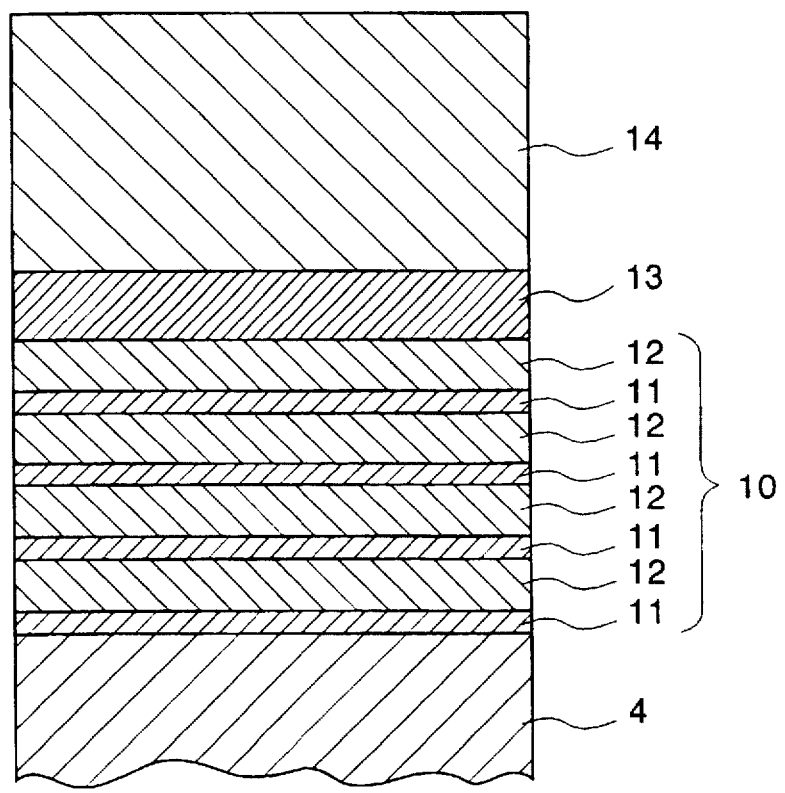

FIG. 8(a) is a diagram illustrating a structure of a semiconductor device as a second embodiment of the present invention and FIG. 8(b) is a diagram illustrating a structure of the ohmic electrode of the semiconductor device. In the figure, numeral 13 designates a Mo barrier layer about 500 Å thick, and numeral 14 designates an Al wiring layer about 10,000 Å thick.

In the method of fabricating the semiconductor device of this second embodiment, in the process of forming the Ti/Al laminated layer film 10 serving as ohmic electrodes 10a, 10b shown in FIG. 1(b) in the, an Mo film 13 and an Al wiring layer 14 are further laminated as shown in FIG. 8(b), and then annealing is performed, whereby ohmic electrodes 10a, 10b connected with the Al wiring layer 14 as shown in FIG. 8(a) are produced. The fabricating process thereafter is the same as those in the first embodiment.

In this second embodiment, the ohmic electrodes 10a, 10b do not comprise gold as in the prior art, adhesion of the Al wiring layer 14 and the ohmic electrodes 10a, 10b is easily possible and, therefore, Al can be used as a wiring and the patterning of wiring by dry etching and the formation of a fine wiring pattern is possible.

In this second embodiment, the Mo barrier layers 13 are formed between the ohmic electrodes 10a, 10b and the Al wiring layers 14 to prevent Ga atoms which diffuse into the Al$_3$Ti alloy particle interface from intruding into the Al wiring layers and raising the wiring resistance, thereby deteriorating the Al wiring layer. Other materials, including, refractory metal materials such as TiN, WSi, WSiN, and the like may be employed instead of Mo. In addition, the Al wiring layer 14 may be directly placed on the ohmic electrodes 10a, 10b without inserting the Mo barrier layer 13.

As described above, in this second embodiment, the Ti/Al laminated layer film 10, the Mo barrier layer 13, and the Al wiring layer 14 are laminated on the n type GaAs layer 4 and it is annealed. Therefore, an ohmic electrode similar to the first embodiment can be formed, the ohmic electrode and the Al wiring layer can be easily connected, and a semiconductor device provided with wiring which can be formed in a fine wiring pattern can be easily obtained.

What is claimed is:

1. A semiconductor device comprising:
   an n type GaAs layer;
   an electrode disposed on the n type GaAs layer, the electrode including at least one pair of Ti and Al films and an Al$_3$Ti alloy in contact with the n type GaAs layer; and
   a high dopant impurity concentration region in the n type GaAs layer proximate a junction interface of the n type GaAs layer and the electrode wherein the electrode is in ohmic contact with the n type GaAs layer.

2. The semiconductor device of claim 1 wherein the the Ti film and the Al film have a ratio of thicknesses of 1:3.

3. The semiconductor device of claim 1 wherein the Ti film and the Al film each have a thickness less than 100 Å.

4. The semiconductor device of claim 1 including an Al wiring layer disposed on the electrode.

5. The semiconductor device of claim 4 including a barrier layer comprising a refractory metal disposed between the Al wiring layer and the electrode.

* * * * *

UNITED STATES PATENT AND TRADEMARK OFFICE
CERTIFICATE OF CORRECTION

PATENT NO. : 5,777,389
DATED : July 7, 1998
INVENTOR(S) : Hattori

It is certified that error appears in the above-identified patent and that said Letters Patent is hereby corrected as shown below:

Title page, item [54] and col. 1, should read as following:
SEMICONDUCTOR DEVICE INCLUDING OHMIC TO N-TYPE GaAs--

Signed and Sealed this

Twelfth Day of January, 1999

Attest:

Attesting Officer

*Acting Commissioner of Patents and Trademarks*